United States Patent
Wei et al.

(10) Patent No.: US 6,407,589 B1
(45) Date of Patent: Jun. 18, 2002

(54) DEVICE FOR CURRENT SENSING IN AN AMPLIFIER WITH PMOS VOLTAGE CONVERSION

(75) Inventors: Liqiong Wei; Kevin X. Zhang, both of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/748,269

(22) Filed: Dec. 27, 2000

(51) Int. Cl.[7] .............................................. G01R 19/00
(52) U.S. Cl. ........................................ 327/55; 327/103
(58) Field of Search .............................. 327/52–57, 103

(56) References Cited

U.S. PATENT DOCUMENTS

| | | | | | |
|---|---|---|---|---|---|
| 3,983,413 A | * | 9/1976 | Gunsagar et al. | ............. | 327/52 |
| 4,937,479 A | * | 6/1990 | Hoshi | ........................... | 327/55 |
| 5,942,919 A | * | 8/1999 | Ang et al. | ..................... | 327/57 |
| 5,982,203 A | * | 11/1999 | Pelella | ......................... | 327/57 |
| 6,282,138 B1 | * | 8/2001 | Wilkins | ....................... | 327/52 |

* cited by examiner

*Primary Examiner*—Kenneth B. Wells
(74) *Attorney, Agent, or Firm*—Antonelli, Terry, Stout & Kraus, LLP

(57) ABSTRACT

A device to sense changes in current level almost instantaneously and convert those current levels, almost instantaneously, into voltage levels that may be used by a microprocessor for logical and mathematical operations. This device employs a current conveyer to receive two inputs representing current levels. Once a sufficient difference in current levels is detected by the current conveyer, the current from each input is passed to a P-sense amplifier that converts the current to an equivalent voltage level and amplifies that voltage level. Thereafter, two outputs are generated reflecting an amplified voltage of the current input.

17 Claims, 1 Drawing Sheet

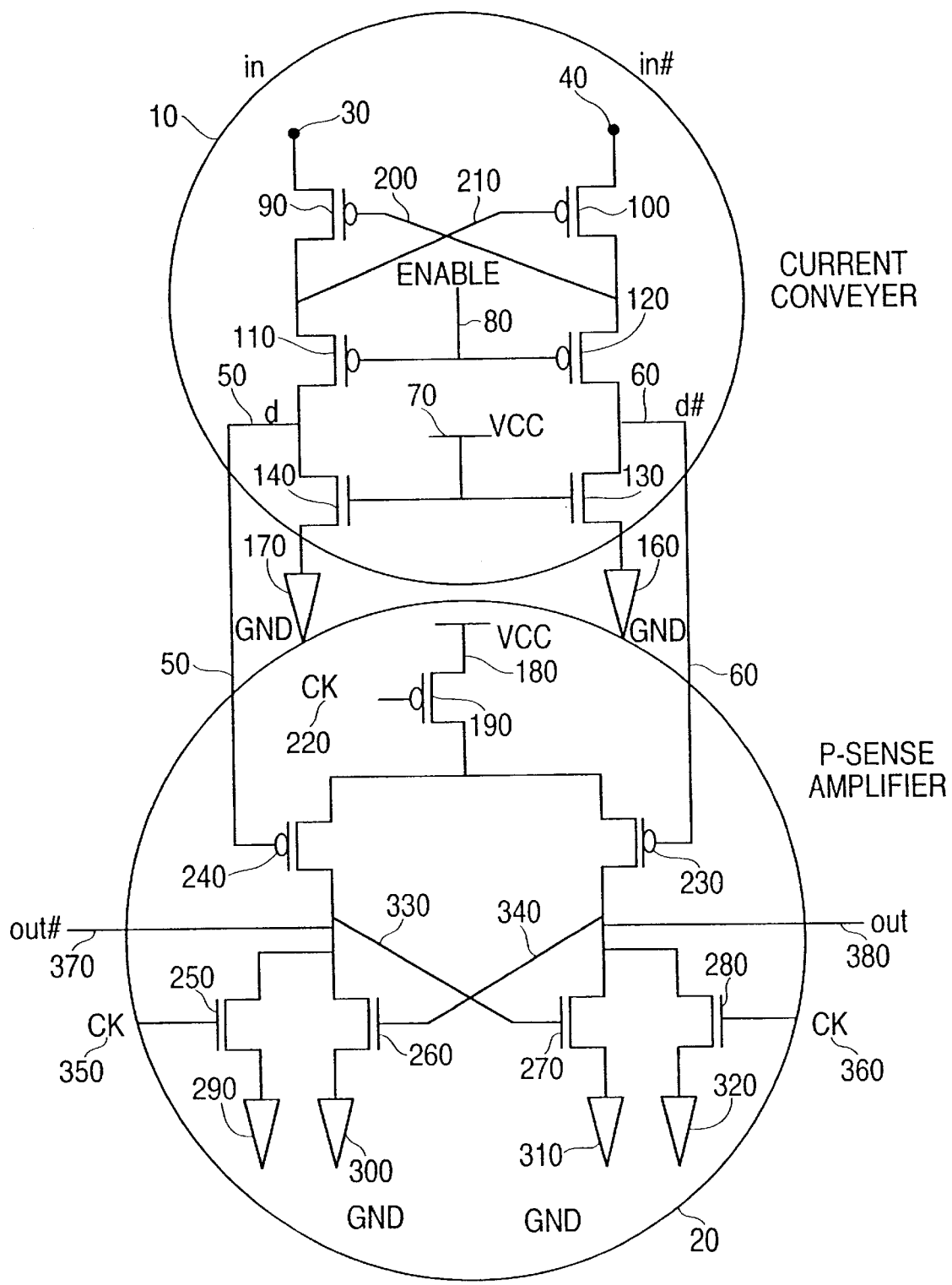

DEVICE FOR CURRENT SENSING IN AN AMPLIFIER WITH PMOS VOLTAGE CONVERSION

FIELD

The invention relates to a device for current sensing in an amplifier with PMOS (Positive channel Metal Oxide Semiconductor) voltage conversion. More specifically, the invention relates to a device that may quickly convert a current detected to a voltage that may be used for processing purposes in a microprocessor.

BACKGROUND

In the rapid development of computers many advancements have been seen in the areas of processor speed, throughput, communications, and fault tolerance. Microprocessor speed is measured in cycles per second or hertz. Today's high-end 32-bit microprocessors operate well in excess of 1 Ghz (gigahertz), one billion cycles per second, and in the near future this is expected to go substantially higher. At this sort of cycle speed a clock would have to generate a pulse or cycle at least once each billionth of a second and usually several orders of magnitude faster. It is during this clock cycle that the processor executes programmed functions. These functions would include everything from a portion of a read function to some mathematical operation. Further, complexity of the operation performed by a microprocessor has increased exponentially. Today, a microprocessor is expected to perform mathematical operations on 32, 64, and a 128 bit words. Further, in microprocessor chips not only are mathematical as well as logical functions performed but memory related functions take plage sugh as the management of cache memory. With the increase in the complexity of the functions performed the lengths in data paths and logic paths required has also increased. This increase in data and logic paths length has served to slow processor execution. This is because the fundamental mechanism used to communicate between components is through resistance/capacitance (RC) networks which are inherently slow. The longer the distance of the logic path the more R/C networks involved and the slower the processor. Thus, the need to increase speed is at odds with the need to increase complexity.

The reason for this conflict lies within the fundamental mechanism by which components in a processor on a single chip exchange information. The fundamental mechanism by which data processors operate is through the representation of logical states in data as binary values (either zero or one). At the hardware level a binary value of one may be represented by high or positive voltage or current, while a binary value of zero may be represented by a low or negative voltage or current. Presently a transmitting circuit would set a voltage high and that would be transmitted to a receiving circuit. The receiving circuit would determine or sense the signal, referred to as voltage sensing, and take the appropriate action.

An alternative approach would utilize current sensing rather than voltage sensing and this is often called a differential current system and the receiving or detecting circuit would be called a current conveyer. This current conveyer has almost zero input resistance at the leading end and thus the current conveyer can detect, almost instantaneously, the presence of current. However, all computations and logic in the microprocessor are still based on voltage rather than current. Therefore, current must then be converted back to voltage and the current mechanisms, prior to the present invention, used to convert from current to voltage are relatively slow because it was more complex requiring more devices, that took up more space on the chip and used more power which required more cooling. Thus, a potential limit, block or envelope exists that may prevent the further increase in microprocessor speed and complexity to one, two, three, or more gigahertz per second.

Therefore, what is needed is a device that will take advantage of the near instantaneous detection of a change in current realized by a current conveyer but will almost as quickly be able to convert this detected current back to a voltage. This device should be simple to implement and thereby be able to operate quickly. Further, it must take up as little space on the microprocessor chip so that the space may be utilized for logic, mathematical functions as well as expanded cache memory.

BRIEF DESCRIPTION OF THE DRAWINGS

The foregoing and a better understanding of the present invention will become apparent from the following detailed description of exemplary embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 1 is an example embodiment of the circuit used to convert current detected back to voltage in the present invention.

DETAILED DESCRIPTION

Before beginning a detailed description of the subject invention, mention of the following is in order. When appropriate, like reference numerals and characters may be used to designate identical, corresponding or similar components in differing figure drawings. Further, in the detailed description to follow, exemplary sizes/models/values/ranges may be given, although the present invention is not limited to the same. As a final note, well-known components of computer networks may not be shown within the FIGS. for simplicity of illustration and discussion, and so as not to obscure the invention.

FIG. 1 is an example embodiment of the device/circuit used to convert differential current detected back to voltage in the present invention. The circuit shown in FIG. 1 of this example embodiment of the present invention is divided into two major components. The first component is a current conveyer 10 and the second is a P-sense amplifier 20.

Still referring to FIG. 1, the current conveyer 10 serves the functions of providing the circuits with zero input resistance so that a current input at input 30 (also labeled "in") and its complement second input 40 (also labeled "in#") may be sensed as a change in current almost instantaneously. Further, the current conveyer 10 will output a relatively small differential voltage at first differential link 50 (also labeled "d") and at second differential link 60 (also labeled "d#"). The current conveyer 10 is enabled using enable signal 80. It is important that a first NMOS (Negative channel Metal Oxide Semiconductor) transistor 130 and second NMOS transistor 140 be tuned or sized to maintain the first differential link 50 (also labeled "d") and the second differential link 60 (also labeled "d#") close to ground to insure P-sense amplifier 20 functions effectively.

Still referring to FIG. 1, the current conveyer 10 also has a first PMOS transistor 90, a second PMOS transistor 100, a third PMOS transistor 110 and a fourth PMOS transistor 120. In addition, first PMOS transistor 90 is cross linked to second input link 40 via link 200 and second PMOS transistor 100 is cross linked to input link 30 via link 210.

Still referring to FIG. 1, the second major component of the present invention is the P-sense amplifier 20. The P-sense amplifier has a second supply voltage 180 connected to fifth PMOS transistor 190 which is in turn connected to a clock 220. The P-sense amplifier 20 has a sixth PMOS transistor 240 and a seventh PMOS transistor 230. Sixth PMOS transistor 240 receives input from first differential link 50 and seventh PMOS transistor 230 receives its input from current conveyer 10 from second differential link 60. In addition, the sixth PMOS transistor 240 and seventh PMOS transistor 230 are connected to an addition four NMOS transistors in the P-sense amplifier 20. The NMOS transistors in the P-sense amplifier 20 are third NMOS transistor 250, fourth NMOS transistor 260, fifth NMOS transistor 270, and sixth NMOS transistor 280. Third NMOS transistor 250 and sixth NMOS 280 are also connected to second clock 350 and third clock 360. Further, third NMOS transistor 250 is connected to ground 290, fourth NMOS transistor 260 is connected to ground 300, fifth NMOS transistor 270 is connected to ground 310, and sixth NMOS transistor 280 is connected to ground 320. The P-sense amplifier 20 generates voltage outputs via first output 370 (also labeled "out#") and second output 380 (also labeled "out"). It should be noted that fifth NMOS transistor 270 is cross connected to output 370 via link 330 while fourth NMOS transistor 260 is cross connected to output 380 via link 340, thereby grounding output 370 and 380 during precharge phase, discussed ahead.

Still referring to FIG. 1, the device having the current conveyer 10 and the P-Sense amplifier 20 operates in two phases. The first phase is a precharge phase in which the enable signal 80 is set to high and the current conveyer 10 is disabled. However, the first NMOS transistor 130 and second NMOS transistor 140 are on because of being connected to the first supply voltage 70 which is providing them with power. Since first NMOS transistor 130 and second NMOS transistor 140 are connected to ground 160 and ground 170, respectively, this maintains first differential link 50 and second differential link 60 at ground also during this precharge phase. Further, second and third clocks 350 and 360 are held high and all the third through sixth NMOS transistors 250–280 are forced to low or to grounds 290 through 320. In addition, first clock 220 is also set high which automatically turns off fifth PMOS transistor 190 by the nature of how PMOS transistors operate. Of course, as would be appreciated by one of ordinary skill in the art, first clock 220, second clock 350, and third clock 360 may be the same clock. This completes the precharge phase which serves to set the device to a ground state including output 370 and 380.

The second phase that the device operates in is an evaluation phase. The evaluation phase serves to activate the device and allows it to detect current and convert it to voltage in a simple and almost instantaneous manner. This begins by the enable signal 80 being set low in order to activate or enable third PMOS transistor 110 and the four PMOS transistor 120. This is opposite to that of the precharge phase where the enable signal 80 is set high and current from input 30 and input 40 are prevented from moving through the current conveyer 10 to the P-sense amplifier 20. Since input 30 and input 40 have differential current being supplied a delta exists between the two inputs. Once sufficient differential voltage is obtained between first differential link 50 and second differential link 60 then clock 220 is set low. As would be appreciated by one of ordinary skill in the art, a differential voltage value of between approximately 100 and 150 millivolts would be adequate to set clock 220 low and thus activate the P-sense amplifier 20 by activating fifth PMOS transistor 190 and enabling supply voltage 180. Current would now be following to sixth PMOS transistor 230 and seventh PMOS transistor 240. However, since the first PMOS transistor 110 and second PMOS transistor 120 have been enabled, a differential voltage now is sensed by sixth PMOS transistor 240 and seventh PMOS transistor 230. Sixth PMOS transistor 240 and seventh PMOS transistor 230 may also be referred to as differential input pairs since they are receiving differential input voltage.

Still referring to FIG. 1, it should also be noted that fourth NMOS transistor 260 is cross connected to output 380 and fifth NMOS transistor 270 is cross connected to output 370. The NMOS transistors in P-sense amplifier 20 include third NMOS transistor 250, fourth NMOS transistor 260, fifth NMOS transistor 270, and sixth NMOS transistor 280. Since fourth NMOS transistor 260 and fifth NMOS transistor 270 are no longer ground they act as feedback devices via links 330 and 340. Further, since a small differential voltage is being applied to P-sense amplifier 20 via current conveyer 10, a large differential voltage would be output from output 370 and output 380 in a positive feedback loop. Thus, either output 370 may be forced high because of a higher differential current and output 380 is forced low or vice versa. Both output 370 and output 380 cannot be high or low at the same time.

For example, if input 30 has a higher current level than input 40, then first differential link 50 would have a higher voltage level than second differential link 60 and as a result the voltage output from output 380 would also be higher than that of output 370.

The benefit resulting from the present invention is that a simple, reliable, fast device is used to convert current representing binary values to voltage representing binary values. Using this device a significant obstacle to more complex and faster microprocessors has been removed. Further, since the design is simpler it requires less space on the microprocessor and uses less energy and thus generate less heat.

While we have shown and described only a few examples herein, it is understood that numerous changes and modifications as known to those skilled in the art could be made to the example embodiment of the present invention. Therefore, we do not wish to be limited to the details shown and described herein, but intend to cover all such changes and modifications as are encompassed by the scope of the appended claims.

We claim:

1. A device to convert current to voltage, comprising:
   a current conveyer, comprising:
   a first PMOS transistor connected to a first current input;
   a second PMOS transistor connected to a second complement current input that is the complement of the first current input;
   a third PMOS transistor connected to the first PMOS transistor and cross linked to the second PMOS transistor;

a fourth PMOS transistor connected to the second PMOS transistor and cross linked to the second PMOS transistor;

a first NMOS transistor connected to the third PMOS transistor, ground and a first voltage supply to output a first differential voltage; and a second NMOS transistor connected to the fourth PMOS transistor, ground and a first voltage supply to output a second differential voltage; and a P-sense amplifier connected to the current conveyor, comprising a plurality of NMOS transistors connected to ground;

a voltage supply; and a plurality of PMOS transistors connected to the plurality of NMOS transistors, the voltage supply and the first and second differential voltage from the current conveyor to generate a plurality of voltage outputs proportional to the first and second differential voltage.

2. The device recited in claim 1, wherein the current conveyer further comprises an enable signal to engage the device in a precharge state when the enable signal is set high.

3. The device recited in claim 2, wherein when the enable signal is set low, and the first and second differential voltage from the current conveyor passes through the current conveyer.

4. The device recited in claim 3, wherein when the enable signal is set low current from the first and second differential voltage from the current conveyor is transmitted to two PMOS transistors of the plurality of PMOS transistors in the P-sense amplifier.

5. The device recited in claim 4, wherein when the first and second differential voltage from the current conveyor are received a plurality of clocks are set to low.

6. The device recited in claim 5, wherein two of the plurality of clocks are connected two NMOS transistors in the P-sense amplifier which are disabled upon receipt of current from the current conveyer.

7. The device recited in claim 6, wherein one clock of the plurality of clocks is connected to a PMOS transistor that is connected to a supply voltage that transmits voltage when the clock goes low.

8. A device to convert current to voltage, comprising:

a current conveyer, comprising:

a plurality of PMOS transistors connected to a first current input and a second complement current input that is the complement of the first current input; and a plurality of NMOS transistors connected to the plurality of PMOS transistors, ground and a voltage supply to generate a first differential voltage and a second differential voltage when the difference between the first current input and the second complement current input exceeds a minimum value, wherein the current conveyor is in a precharge state when an enable signal is set high and in an evaluation phase when the enable signal is set low; and a P-sense amplifier connected to the current conveyor, comprising a plurality of NMOS transistors connected to ground;

a voltage supply; and a plurality of PMOS transistors connected to the plurality of NMOS transistors, the voltage supply and the first differential voltage and the second differential voltage to generate a plurality of voltage outputs proportional to the first current input and the second complement current input when the enable signal is set low.

9. The device recited in claim 8, wherein current is received by the P-sense amplifier from the current conveyer when a plurality of clocks connected to the plurality of PMOS transistors and the plurality of NMOS transistors are set to low.

10. The device recited in claim 9, wherein two of the plurality of clocks are connected two NMOS transistors in the P-sense amplifier which are disabled upon receipt of current from the current conveyer.

11. The device recited in claim 10, wherein one clock of the plurality of clocks is connected to a PMOS transistor of the plurality of PMOS transistors that is connected to a supply voltage that transmits voltage when the clock goes low.

12. A device to convert current to voltage, comprising:

a current conveyer, comprising:

a plurality of PMOS transistors connected to a first current input and a second complement current input that is the complement of the first current input; and a plurality of NMOS transistors connected to the plurality of PMOS transistors, ground and a voltage supply to generate a first differential voltage and a second differential voltage when the difference between the first current input and the second complement current input exceeds a minimum value; and a P-sense amplifier connected to the current conveyor, comprising a plurality of NMOS transistors connected to ground;

a voltage supply;

a plurality of PMOS transistors connected to the plurality of NMOS transistors, the voltage supply and the first differential voltage and the second differential voltage to generate a plurality of voltage outputs proportional to the first current input and the second complement current input when a clock of a plurality of clocks is connected to a PMOS transistor of the plurality of PMOS transistors that is connected to the supply voltage transmits voltage when the clock goes low of the plurality of clocks and current is supplied when the clock of the plurality of clocks goes low.

13. The device recited in claim 12, wherein the current conveyer further comprises an enable signal to engage the device in a precharge state when the enable signal is set high.

14. The device recited in claim 13, wherein when the enable signal is set low first differential current and a second differential current passes through the current conveyer.

15. The device recited in claim 14, wherein when the enable signal is set low current from two current inputs from the plurality of current inputs is transmitted to two PMOS transistors of the plurality of PMOS transistors in the P-sense amplifier.

16. The device recited in claim 15, wherein when current is received from the current conveyer when the plurality of clocks are set to low.

17. The device recited in claim 16, wherein two of the plurality of clocks are connected two NMOS transistors in the P-sense amplifier which are disabled upon receipt of current from the current conveyer.

* * * * *